(12) United States Patent
Hsieh et al.

(10) Patent No.: US 12,456,677 B2
(45) Date of Patent: Oct. 28, 2025

(54) VIA LANDING ON FIRST AND SECOND BARRIER LAYERS TO REDUCE CLEANING TIME OF CONDUCTIVE STRUCTURE

(71) Applicant: Taiwan Semiconductor Manufacturing Company, Ltd., Hsinchu (TW)

(72) Inventors: Te-Hsien Hsieh, Kaohsiung (TW); Yu-Hsing Chang, Taipei (TW); Yi-Min Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 176 days.

(21) Appl. No.: 18/353,997

(22) Filed: Jul. 18, 2023

(65) Prior Publication Data

US 2023/0361024 A1 Nov. 9, 2023

Related U.S. Application Data

(62) Division of application No. 17/197,381, filed on Mar. 10, 2021, now Pat. No. 11,776,901.

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76814* (2013.01); *H01L 23/53223* (2013.01); *H01L 23/53295* (2013.01)

(58) Field of Classification Search
CPC ........... H01L 23/53238; H01L 23/5226; H01L 23/53233; H01L 23/53295; H01L 21/76877; H01L 21/76814; H01L 21/76843; H01L 21/76834
See application file for complete search history.

(56) References Cited

U.S. PATENT DOCUMENTS

| | | |
|---|---|---|
| 6,674,170 B1 | 1/2004 | Ngo et al. |
| 7,291,558 B2 | 11/2007 | Geffken et al. |
| 8,304,343 B2 | 11/2012 | Choi et al. |

(Continued)

OTHER PUBLICATIONS

Wikipedia.org "Ellingham Diagram." Published on Jan. 22, 2021.

(Continued)

*Primary Examiner* — Zandra V Smith
*Assistant Examiner* — John M Parker
(74) *Attorney, Agent, or Firm* — Eschweiler & Potashnik, LLC

(57) ABSTRACT

In some embodiments, the present disclosure relates to an integrated chip that includes a conductive structure arranged within a substrate or a first dielectric layer. A first barrier layer is arranged on outermost sidewalls and a bottom surface of the conductive structure. A second barrier layer is arranged on outer surfaces of the first barrier layer. The second barrier layer separates the first barrier layer from the substrate or the first dielectric layer. A second dielectric layer is arranged over the substrate or the first dielectric layer. A via structure extends through the second dielectric layer, is arranged directly over topmost surfaces of the first and second barrier layers, and is electrically coupled to the conductive structure through the first and second barrier layers.

20 Claims, 10 Drawing Sheets

(56) References Cited

U.S. PATENT DOCUMENTS

| | | |
|---|---|---|
| 10,522,399 B2 | 12/2019 | Yang et al. |
| 2002/0016063 A1 | 2/2002 | Chen et al. |
| 2005/0263891 A1 | 12/2005 | Lee et al. |
| 2008/0265417 A1 | 10/2008 | Kawamura et al. |
| 2012/0299188 A1 | 11/2012 | Chen et al. |
| 2013/0249045 A1 | 9/2013 | Kang et al. |
| 2018/0233444 A1 | 8/2018 | Adusumilli et al. |
| 2019/0148294 A1 | 5/2019 | Ting et al. |
| 2019/0363048 A1* | 11/2019 | Zhao .................. H01L 23/5226 |
| 2020/0105664 A1 | 4/2020 | Han et al. |
| 2020/0227313 A1 | 7/2020 | Choi et al. |

OTHER PUBLICATIONS

Wenger et al. "Influence of the electrode material on HfO2 metal-insulator-metal capacitors." J. Vac. Sci. Technol. B27 (1), Jan./Feb. 2009, published on Feb. 9, 2009.

Wittmer et al. "Oxidation kinetics of TiN thin films" Journal of Applied Physics 52, 6659 (1981), published on Jul. 21, 1981.

Non-Final Office Action dated Feb. 2, 2023 for U.S. Appl. No. 17/197,381.

Notice of Allowance dated Jun. 5, 2023 for U.S. Appl. No. 17/197,381.

\* cited by examiner

VIA LANDING ON FIRST AND SECOND BARRIER LAYERS TO REDUCE CLEANING TIME OF CONDUCTIVE STRUCTURE

REFERENCE TO RELATED APPLICATION

This application is a Divisional of U.S. application Ser. No. 17/197,381, filed on Mar. 10, 2021, the contents of which are hereby incorporated by reference in their entirety.

BACKGROUND

Modern day integrated chips comprise millions or billions of semiconductor devices formed on a semiconductor substrate (e.g., silicon). Integrated chips (ICs) may use many different types of semiconductor devices, depending on an application of an IC. Manufacturing techniques and IC designs are being researched to reduce manufacturing time and resources while maintaining and/or improving performance of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
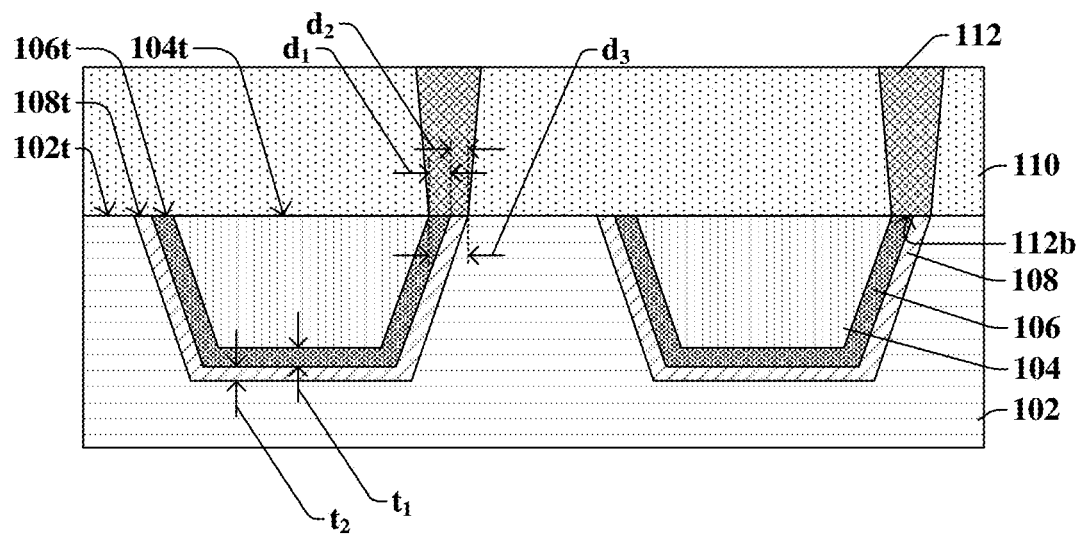
FIG. 1 illustrates a cross-sectional view of some embodiments of an integrated chip comprising a conductive structure having outer sidewalls and a lower surface surrounded by first and second barrier layers, wherein a via structure directly contacts upper surfaces of the first and second barrier layers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips comprise via structures arranged over and coupled to underlying conductive structures. For example, in some instances, an integrated chip may comprise a semiconductor device such as, for example, a transistor, a capacitor, or the like. In some such instances, the semiconductor device may comprise a contact via arranged over an electrode, which may respectively correspond to a via structure and a conductive structure. Further, in some instances, an integrated chip may comprise an interconnect structure. The interconnect structure may comprise interconnect wires and interconnect vias, which may respectively correspond to conductive structures and via structures.

To form a via structure over an underlying conductive structure, the conductive structure may first be formed within a substrate or a first dielectric layer through various steps of deposition, photolithography, and/or removal processes. To form the via structure over the conductive structure, a second dielectric layer may be formed over the conductive structure, and an opening, which exposes a top surface of the conductive structure, may be formed within the second dielectric layer through photolithography and removal (e.g., etching) processes. When the top surface of the conductive structure is exposed, the top surface of the conductive structure may oxidize thereby forming a metal-oxide residue on the conductive structure. Thus, a cleaning process, such as a plasma cleaning process, may be performed to remove the metal-oxide residue on the conductive structure. Then, a conductive material may be formed within the opening to form the via structure arranged over and electrically coupled to the conductive structure. By removing the metal-oxide residue, the contact resistance between the via structure and the conductive structure is reduced.

Various embodiments of the present disclosure relate to preventing or reducing the amount of metal-oxide residue formed on the conductive structure to eliminate the cleaning process or reduce the time of the metal-oxide cleaning process, thereby reducing manufacturing time and resources. In some embodiments, a first opening is formed within a substrate or first dielectric layer. Prior to forming the conductive structure within the first opening, a first barrier layer is formed over a second barrier layer within the first opening to prevent or reduce the amount of metal-oxide residue forming on the conductive structure. The first barrier layer and the second barrier layer comprise conductive materials that are more resistant to oxidation than a conductive material used to form the conductive structure.

In some embodiments, the conductive material is then formed on the second barrier layer to fill the first opening and form the conductive structure. In some embodiments, a second dielectric layer is formed over the conductive structure, and a second opening is formed in the second dielectric layer to expose the first barrier layer and the second barrier layer. Because the first and second barrier layers have a higher resistance to oxidation than the conductive structure, less metal-oxide residue will form compared to if the conductive structure were exposed. Therefore, if a cleaning process is still needed to remove any metal-oxide residue from the first and second barrier layers, the cleaning process will take less time compared to the time it takes to clean the metal-oxide residue from the conductive structure. Then, in some embodiments, the via structure is formed within the second opening and is still electrically coupled to the conductive structure by way of the first and second barrier layers. Thus, cleaning times and the presence of metal-oxide between the conductive structure and the via structure are reduced to respectively improve the manufacturing times and overall performance (e.g., reduced contact resistance) of the integrated chip.

FIG. 1 illustrates a cross-sectional view 100 of some embodiments of an integrated chip comprising a via structure arranged on topmost surfaces of first and second barrier layers.

In some embodiments, the integrated chip of FIG. 1 includes a conductive structure 104 arranged within a substrate 102. In some embodiments, the conductive structure 104 may be a conductive wire, an electrode, or some other conductive feature of a semiconductor device. In some embodiments, the conductive structure 104 is arranged on a first barrier layer 106, wherein the first barrier layer 106 is arranged on outer sidewalls and a bottom surface of the conductive structure 104. In some embodiments, the first barrier layer 106 is arranged on a second barrier layer 108, wherein the second barrier layer 108 separates the first barrier layer 106 from the substrate 102. In some embodiments, a topmost surface 102t of the substrate 102, a topmost surface 108t of the second barrier layer 108, a topmost surface 106t of the first barrier layer 106, and a topmost surface 104t of the conductive structure 104 are substantially coplanar.

In some embodiments, the conductive structure 104 comprises a first conductive material; the first barrier layer 106 comprises a second conductive material; and the second barrier layer 108 comprises a third conductive material. In some embodiments, the second conductive material of the first barrier layer 106 and the third conductive material of the second barrier layer 108 each have a higher resistance to oxidation than the first material of the conductive structure 104. In some embodiments, the resistance to oxidation of the first, second, and third conductive materials is measured by the Gibbs free energy of formation of the metal and oxygen to form the metal oxide. To properly compare the Gibbs free energy of formation amongst the different conductive materials, it will be appreciated that the Gibbs free energy is measured at the same conditions such as, a same temperature, pressure, and oxygen conditions. The more negative the Gibbs free energy of formation for a metal oxide, the easier the oxidation of that metal is, or in other words, the lower the resistance to oxidation that that metal has.

In some embodiments, the first barrier layer 106 has a first thickness $t_1$ in a range of between, for example, approximately 25 angstroms and approximately 100 angstroms. In some embodiments, the second barrier layer 108 has a second thickness $t_2$ in a range of between, for example, approximately 25 angstroms and approximately 100 angstroms. In some embodiments, the topmost surface 106t of the first barrier layer 106 has a width equal to a first distance $d_1$. In some embodiments, the first distance $d_1$ is larger than the first thickness $t_1$. In some embodiments, the topmost surface 108t of the second barrier layer 108 has a width equal to a second distance $d_2$. In some embodiments, the second distance $d_2$ is larger than the second thickness $t_2$.

In some embodiments, a dielectric layer 110 is arranged over the substrate 102, and a via structure 112 extends through the dielectric layer 110 and is electrically coupled to the conductive structure 104. In some embodiments, a bottommost surface 112b of the via structure 112 directly contacts the topmost surface 106t of the first barrier layer 106 and the topmost surface 108t of the second barrier layer 108. In some embodiments, the bottommost surface 112b of the via structure 112 does not contact the substrate 102 or the conductive structure 104. In other words, in some embodiments, the via structure 112 extends through the dielectric layer 110 to directly contact the first and second barrier layers 106, 108, wherein the topmost surface 102t of the substrate 102 and the topmost surface 104t of the conductive structure 104 are completely covered by the dielectric layer 110. In some embodiments, the bottommost surface 112b of the via structure 112 has a width equal to a third distance $d_3$, which may be in a range of between, for example, approximately 50 angstroms and approximately 200 angstroms. In some embodiments, a sum of the first and second distances $d_1$, $d_2$ is greater than or equal to the third distance $d_3$ such that the via structure 112 does not directly contact the conductive structure 104 or the substrate 102.

In some embodiments, to form the via structure 112, an opening is formed within the dielectric layer 110 to expose the topmost surface 106t of the first barrier layer 106 and the topmost surface 108t of the second barrier layer 108. Because the first and second barrier layers 106, 108 comprise materials that have a higher resistance to oxidation compared to the first conductive material of the conductive structure 104, when the first and second barrier layers 106, 108 are exposed to the environment upon formation of the opening in the dielectric layer 110, less metal oxide residue forms on the first and second barrier layers 106, 108 than if the conductive structure 104 were exposed by the opening. Thus, in some embodiments, a cleaning process used to remove metal oxide residue on the first and second barrier layers 106, 108 may be omitted or performed for a shorter period of time compared to if the conductive structure 104 were exposed by the opening, thereby reducing manufacturing time and resources. Then, in some embodiments, the via structure 112 may be formed within the opening of the dielectric layer 110 and be electrically coupled to the conductive structure 104 by way of the first and second barrier layers 106, 108 that are free or substantially free from metal oxide residue.

Figure 2:
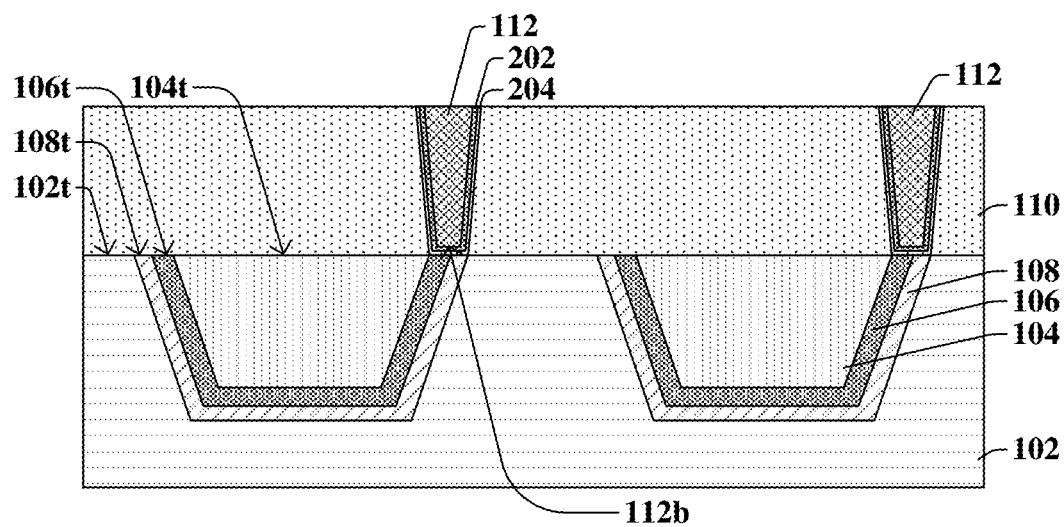
FIG. 2 illustrates a cross-sectional view of some other embodiments of an integrated chip comprising a via structure arranged over and coupled to a conductive structure, wherein the via structure is coupled to the conductive structure by way of first and second barrier layers arranged on outer sidewalls of the conductive structure.

FIG. 2 illustrates a cross-sectional view 200 of some other embodiments of an integrated chip comprising a via structure arranged over topmost surfaces of first and second barrier layers.

In some embodiments, barrier layers may also be arranged on the via structure 112. For example, in some embodiments, the via structure 112 is arranged over a third barrier layer 202, wherein the third barrier layer 202 is arranged on outer sidewalls and the bottommost surface 112b of the via structure 112. In some embodiments, the third barrier layer 202 may be arranged on a fourth barrier layer 204. Thus, in some embodiments, the fourth barrier layer 204 may directly contact the topmost surface 106t of the first barrier layer 106 and the topmost surface 108t of the second barrier layer 108. In some other embodiments, the fourth barrier layer 204 may be omitted. Thus, in some other embodiments, the third barrier layer 202 may directly contact the topmost surface 106t of the first barrier layer 106 and the topmost surface 108t of the second barrier layer 108.

In some embodiments, the bottommost surface 112b of the via structure 112 is spaced apart from the topmost surface 106t of the first barrier layer 106 and the topmost surface 108t of the second barrier layer 108 by the third and fourth barrier layers 202, 204. However, in some such embodiments, the via structure 112 is still electrically coupled to the first barrier layer 106, the second barrier layer 108, and the conductive structure 104. Further, in some such embodiments, the bottommost surface 112b of the via structure 112 still directly overlies the topmost surface 106t of the first barrier layer 106 and the topmost surface 108t of the second barrier layer 108. In some embodiments, the third and fourth barrier layers 202, 204 may comprise materials that have a higher resistance to oxidation than a material of the via structure 112. In some embodiments, the third and fourth barrier layers 202, 204 may act as metal diffusion barrier layers and/or glue layers for the via structure 112.

In some embodiments, the first conductive material of the conductive structure 104 may comprise aluminum or aluminum copper. In some such embodiments, the Gibbs free energy of formation for aluminum oxide (i.e., for aluminum to react with oxygen and form aluminum oxide) has a first value. In some embodiments, when the first conductive material comprises aluminum, the first value may be in a range of between, for example, approximately −1600 kilojoules per mol and approximately −1550 kilojoules per mol. In some embodiments, the second conductive material of the first barrier layer 106 may comprise, for example, titanium or titanium nitride. In some such embodiments, the Gibbs free energy of formation for titanium oxide (i.e., for titanium to react with oxygen and form titanium oxide) has a second value. The second value is less negative than the first value; or in other words, the first and second values are negative, and an absolute value of the second value is less than an absolute value of the first value. In some embodiments, when the second conductive material comprises titanium, the second value may be in a range of between, for example, approximately −600 kilojoules per mol and approximately −500 kilojoules per mol.

Further, in some embodiments, the third conductive material of the second barrier layer 108 may comprise, for example, tantalum or tantalum nitride. In some such embodiments, the Gibbs free energy of formation for tantalum oxide (i.e., for tantalum to react with oxygen and form tantalum oxide) has a third value. The third value is less negative than the first value; or in other words, the first and third values are negative, and an absolute value of the third value is less than an absolute value of the first value. In some embodiments, when the third material comprises tantalum, the third value may be in a range of between, for example, approximately −1550 kilojoules per mol and approximately −1500 kilojoules per mol. Thus, in some embodiments, the second and third conductive materials are different such that the second and third values are different. In some other embodiments, the second and third conductive materials may be the same such that the second value is equal to the third value.

It will be appreciated that the conductive structure 104, the first barrier layer 106, and the second barrier layer 108 may comprise other conductive materials, wherein the first and second barrier layers 106, 108 comprise conductive materials that have a higher resistance to oxidation compared to the first conductive material of the conductive structure 104. Further, in some embodiments, the first barrier layer 106 and/or the second barrier layer 108 may act as a metal diffusion barrier layer to prevent the conductive structure 104 from diffusing into the substrate 102 and contributing the cross-talk amongst other devices. In some embodiments, the first barrier layer 106 and/or the second barrier layer 108 may act as a glue layer, wherein the conductive structure 104 adheres to the first barrier layer 106 better than the substrate 102, for example. Nevertheless, because of the first and second barrier layers 106, 108, cleaning processes may be reduced in time or omitted when forming the via structure 112 over the conductive structure 104.

Figure 3:
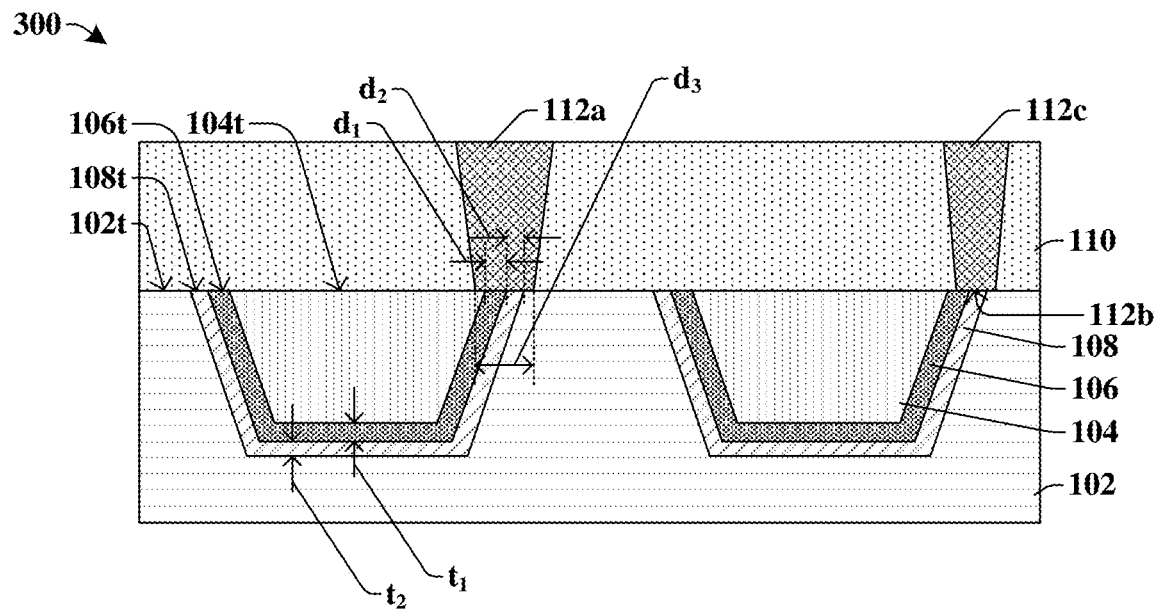
FIG. 3 illustrates a cross-sectional view of yet some other embodiments of an integrated chip comprising a via structure arranged over and coupled to a conductive structure, wherein the via structure is coupled to the conductive structure, a first barrier layer, and a second barrier layer.

FIG. 3 illustrates a cross-sectional view 300 of yet some other embodiments of an integrated chip comprising a via structure arranged over topmost surfaces of first and second barrier layers.

The cross-sectional view 300 includes a first via structure 112a and a second via structure 112c to show some alternative embodiments of a via structure (e.g., 112a, 112c) arranged over and electrically coupled to a conductive structure 104. In some embodiments, the first via structure 112a may directly contact the topmost surface 102t of the substrate 102. In some embodiments, the first via structure 112a may directly contact the topmost surface 104t of the conductive structure 104. For example, in some embodiments, the third distance $d_3$ of the bottommost surface 112b of the first via structure 112a may be greater than a sum of the first and second distances $d_1$, $d_2$ of the first and second barrier layers 106, 108. In some such embodiments, the third distance $d_3$ is greater than a sum of the first and second distances $d_1$, $d_2$ due to photolithography critical dimension constraints.

In some other embodiments, as illustrated by the second via structure 112c, the bottommost surface 112b of the second via structure 112c may have a width equal to the third distance $d_3$ that is less than or about equal to a sum of the first and second distances $d_1$, $d_2$. However, in some such embodiments, even if the third distance $d_3$ is less than or about equal to a sum of the first and second distances $d_1$, $d_2$, the bottommost surface 112b of the second via structure 112c may still directly contact the substrate 102 or the conductive structure 104 because of the precision and accuracy of photolithography methods that prevent the second via structure 112c from landing directly on the topmost surface 106t of the first barrier layer 106 and the topmost surface 108t of the second barrier layer 108 without landing directly on the substrate 102 or the conductive structure 104.

However, in some embodiments, even if the via structure (e.g., 112a, 112c) directly contacts a portion of the conductive structure 104, the time it would take for a cleaning process used to remove metal oxide residue on the conductive structure 104 prior to forming the via structure (e.g., 112a, 112c) is reduced because less of the topmost surface 104t of the conductive structure 104 is exposed and oxidized compared to if the via structure (e.g., 112a, 112c) were formed directly and only on the topmost surface 104t of the conductive structure 104.

Figure 4:
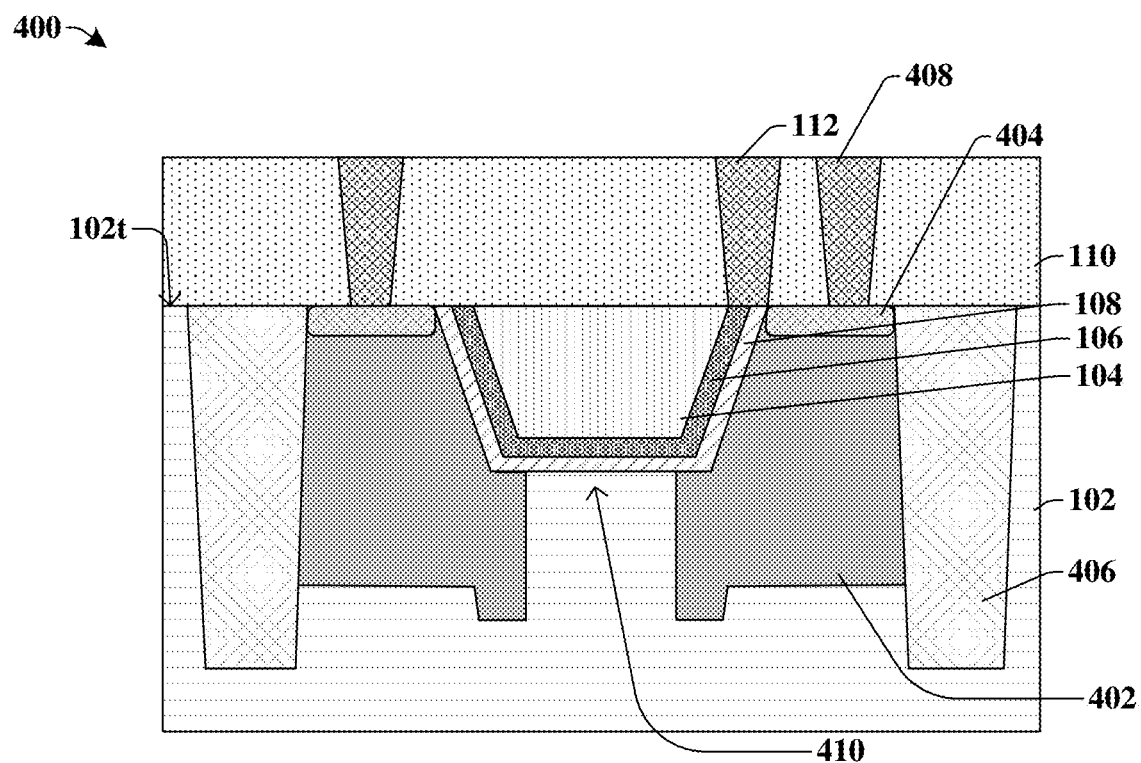
FIG. 4 illustrates a cross-sectional view of some embodiments of an integrated chip comprising a transistor structure, wherein a gate electrode of the transistor structure is arranged on first and second barrier layers, and wherein contact structure coupled to the gate electrode is arranged directly on the first and second barrier layers.

FIG. 4 illustrates a cross-sectional view 400 of some embodiments of an integrated chip comprising a transistor structure, wherein a gate electrode of the transistor structure is arranged on first and second barrier layers.

In some embodiments, the conductive structure 104 corresponds to a gate electrode of a transistor device as illustrated in FIG. 4. In some embodiments, the transistor device may be a metal-oxide-semiconductor field effect transistor (MOSFET), wherein the gate electrode (i.e., conductive structure 104) is arranged below the topmost surface 102t of the substrate 102. It will be appreciated that the conductive structure 104 arranged on first and second barrier layers 106, 108 may be part of other types of transistors, memory devices, and semiconductor devices than a MOSFET. In some embodiments, the first and/or second barrier layers 106, 108 may correspond to gate dielectric layers that influence a work function and thus, threshold voltage of the overall MOSFET.

In some embodiments, the MOSFET of FIG. 4 further comprises source/drain regions 404 arranged within the substrate 102 and on each side of the conductive structure 104. For example, in some embodiments, the conductive structure 104 is spaced apart from the source/drain regions 404 by the first and second barrier layers 106, 108. Further, in some embodiments, lightly doped source/drain extension regions 402 are arranged below the source/drain regions 404 and on outer sidewalls of the conductive structure 104. In some embodiments, an isolation structure 406 surrounds the lightly doped source/drain extension regions 402, the source/drain regions 404, and the conductive structure 104 to electrically isolate the MOSFET from other devices arranged within the substrate 102.

In some embodiments, the via structure 112 may still be arranged over and coupled to the first and second barrier layers 106, 108. Further, in some embodiments, contact vias 408 extend through the dielectric layer 110 and are coupled to the source/drain regions 404. When a sufficient voltage bias is applied to the conductive structure 104 through the via structure 112 and applied to the source/drain regions 404 through the contact vias 408, mobile charge carriers may flow through a channel region 410 of the substrate 102 arranged below the conductive structure 104 and between the lightly doped source/drain extension regions 402.

In some embodiments, the MOSFET of FIG. 4 is known as a "recessed" MOSFET because the gate electrode (i.e., conductive structure 104) is arranged within the substrate 102. The recessed MOSFET saves space in the vertical direction of the integrated chip. In some embodiments, because of the first and second barrier layers 106, 108, the time it takes to manufacture the recessed MOSFET is reduced compared to other recessed MOSFETs comprising a contact via directly contacting an upper surface of the gate electrode.

Figure 5:
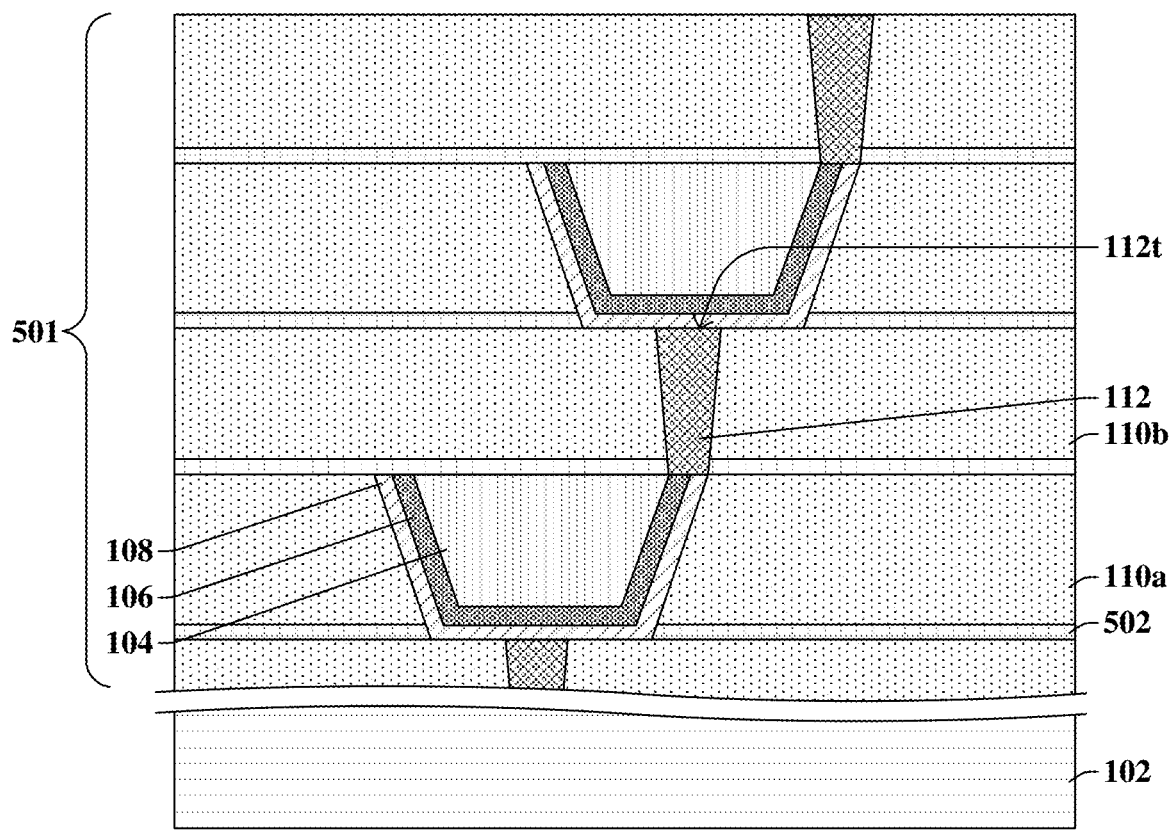
FIG. 5 illustrates a cross-sectional view of some embodiments of an interconnect structure arranged over a substrate, wherein interconnect vias are arranged over interconnect wires and are coupled to interconnect wires by way of first and second barrier layers arranged on surfaces of the interconnect wires.

FIG. 5 illustrates a cross-sectional view 500 of some embodiments of an interconnect structure arranged over a substrate, wherein interconnect vias are coupled to interconnect wires by way of first and second barrier layers arranged on surfaces of the interconnect wires.

In some embodiments, the conductive structure 104 is arranged within a first dielectric layer 110a and corresponds to an interconnect wire of an interconnect structure 501 arranged over the substrate 102. In some embodiments, the via structure 112 is arranged within a second dielectric layer 110b that is arranged over the conductive structure 104 and the first dielectric layer 110a. In some embodiments, the interconnect structure 501 comprises a network of the conductive structures 104 and via structures 112 that couples various devices to one another. For example, in some embodiments, a transistor device may be arranged on or within the substrate 102, and a memory device may be arranged over the interconnect structure 501 shown in FIG. 5. In some such embodiments, the interconnect structure 501 may provide a pathway for signals (e.g., current, voltage) to travel between the transistor device and the memory device. Because the cleaning process is omitted or reduced in time, the interconnect structure 501 can be manufactured more quickly when the via structure 112 directly contacts the first and second barrier layers 106, 108 compared to the conductive structure 104.

In some embodiments, the interconnect wire (i.e., conductive structure 104) is arranged on the first barrier layer 106, and the first barrier layer 106 is arranged on the second barrier layer 108. In some embodiments, the via structure 112 is arranged over and is electrically coupled to the first and second barrier layers 106, 108. In some embodiments, the interconnect structure 501 further comprises etch stop layers 502. In some such embodiments, the second barrier layer 108 may extend through one of the etch stop layers 502 to contact a lower one of the via structures 112, and an upper one of the via structures 112 may extend through one of the etch stop layers 502 to contact the first and second barrier layers 106, 108. Thus, in some embodiments, a topmost surface 112t of one of the via structures 112 may directly contact one of the second barrier layers 108 such that the topmost surface 112t of the via structure 112 is spaced apart from the conductive structure 104 by the first and second barrier layers 106, 108.

In some embodiments, the first and second dielectric layers 110a, 110b may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the etch stop layers 502 may comprise a nitride (e.g., silicon nitride, silicon oxynitride), a carbide (e.g., silicon carbide), or some other suitable etch stop material. In some embodiments, the via structure 112 comprises a conductive material such as, for example, copper, aluminum, titanium, tantalum, tungsten, or some other suitable conductive material. In some embodiments, the first material of the conductive structure 104 has a lower resistance to oxidation than the second material of the first barrier layer 106 and the third material of the second barrier layer 108 to reduce cleaning processing necessary to form the via structure 112 on the first and second barrier layers 106, 108, thereby increasing the number of integrated chips that may be manufactured per hour.

FIGS. 6-16 illustrate cross-sectional views 600-1600 of some embodiments of a method of forming a via structure coupled to a conductive structure by exposing first and second barrier layers arranged on outer sidewalls of the conductive structure to mitigate cleaning of the conductive structure and increase manufacturing time. Although FIGS. 6-16 are described in relation to a method, it will be appreciated that the structures disclosed in FIGS. 6-16 are not limited to such a method, but instead may stand alone as structures independent of the method.

Figure 6:
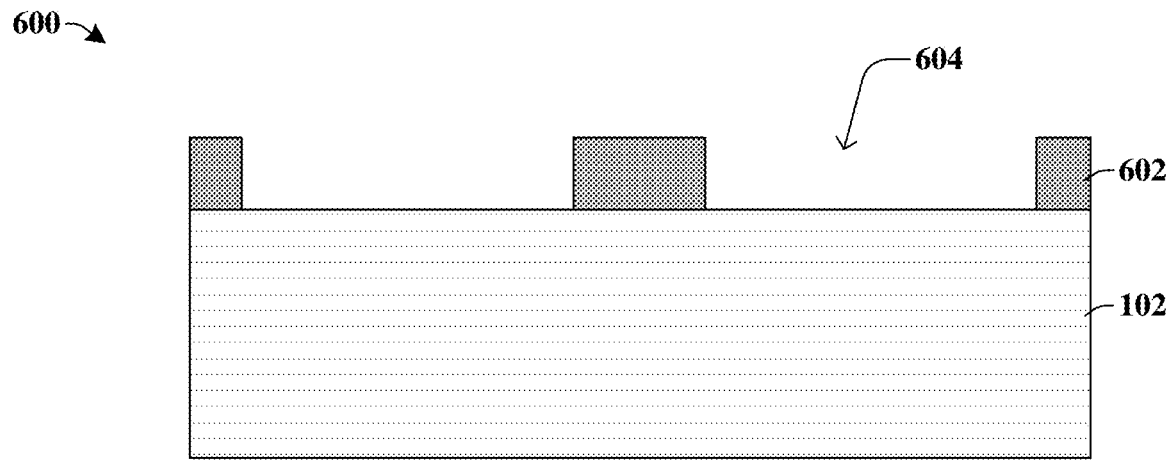
FIGS. 6-16 illustrate cross-sectional views of some embodiments of a method of forming a conductive structure over a first barrier layer and a second barrier layer and of forming a via structure over the conductive structure and coupled to the conductive structure by exposing the first and second barrier layers.

As shown in cross-sectional view 600 of FIG. 6, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, a first masking structure 602 is formed over the substrate 102. In some embodiments, the first masking structure 602 may be formed through various steps using deposition, photolithography, and removal (e.g., etching) processes. In some embodiments, the first masking structure 602 comprises a photoresist material or a hard mask material. In some embodiments, the first masking structure 602 comprises first openings 604 formed by way of photolithography and removal (e.g., etching processes) according to a photoreticle in order to expose upper surfaces of the substrate 102.

It will be appreciated that in some other embodiments, the first masking structure 602 may be formed directly on a first dielectric layer (e.g., 110a of FIG. 5), wherein the first dielectric layer (e.g., 110a of FIG. 5) is arranged over the substrate 102. In some such other embodiments, the first openings 604 of the first masking structure 602 would expose upper surfaces of the first dielectric layer (e.g., 110a of FIG. 5).

Figure 7:
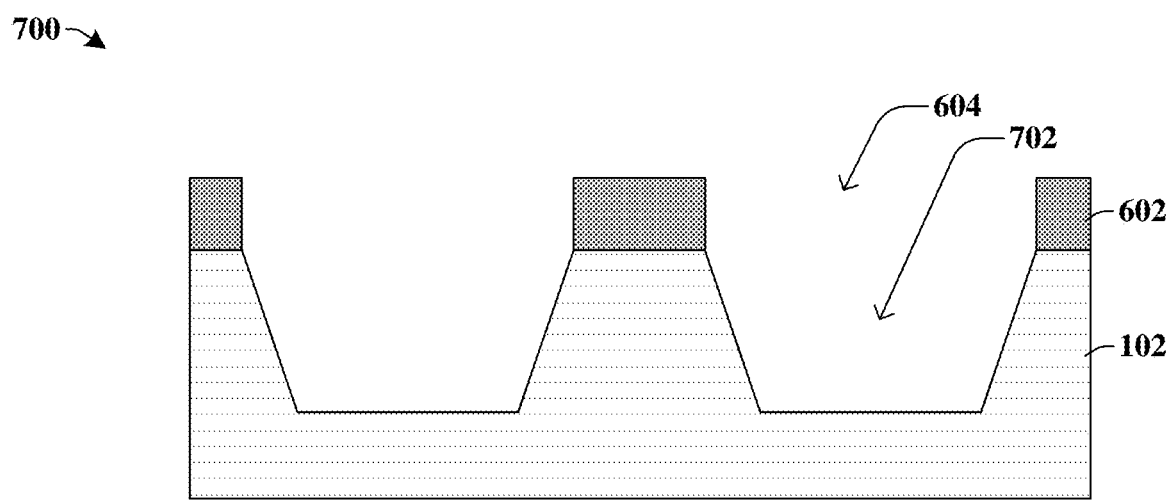

As shown in cross-sectional view 700 of FIG. 7, in some embodiments, a removal process is performed to remove portions of the substrate 102 arranged directly below the first openings 604 of the first masking structure 602 to form second openings 702 in the substrate 102. In some embodiments, the removal process of FIG. 7 comprises a wet and/or dry etching process. In some embodiments, the second openings 702 of the substrate 102 do not extend all the way through the substrate 102. In other embodiments, the second openings 702 may extend all the way through the substrate 102 if another layer of material is arranged below the substrate 102, for example.

Figure 8:
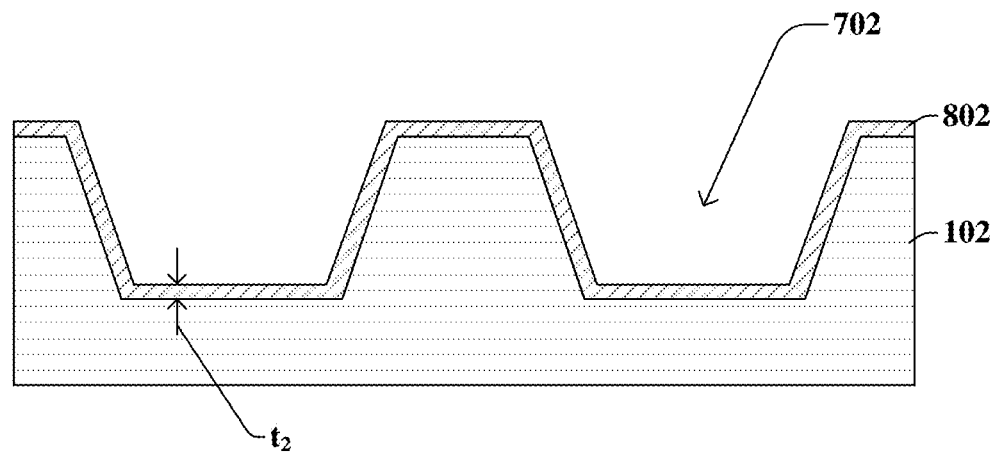

As shown in cross-sectional view 800 of FIG. 8, in some embodiments, the first masking structure (602 of FIG. 7) is removed, and a continuous second barrier layer 802 is formed over the substrate 102 and lines the second openings 702 of the substrate 102. In some other embodiments, the first masking structure (602 of FIG. 7) may remain and thus, the continuous second barrier layer 802 is also formed on the first masking structure (602 of FIG. 7). In some embodiments, the continuous second barrier layer 802 comprises a third conductive material. In some embodiments, the third conductive material may be or comprise, for example, titanium, tantalum, or some other suitable conductive material. In some embodiments, the continuous second barrier layer 802 is formed by way of a deposition process (e.g., physical vapor deposition (PVD), chemical vapor deposition (CVD), atomic layer deposition (ALD), sputtering, etc.).

In some embodiments, the continuous second barrier layer 802 is formed to a second thickness $t_2$. In some embodiments, the second thickness $t_2$ is in a range of between, for example, approximately 25 angstroms and approximately 100 angstroms. The continuous second barrier layer 802 does not completely fill the second openings 702 of the substrate 102, and thus, the second thickness $t_2$ is less than a depth of the second openings 702 of the substrate 102.

Figure 9:
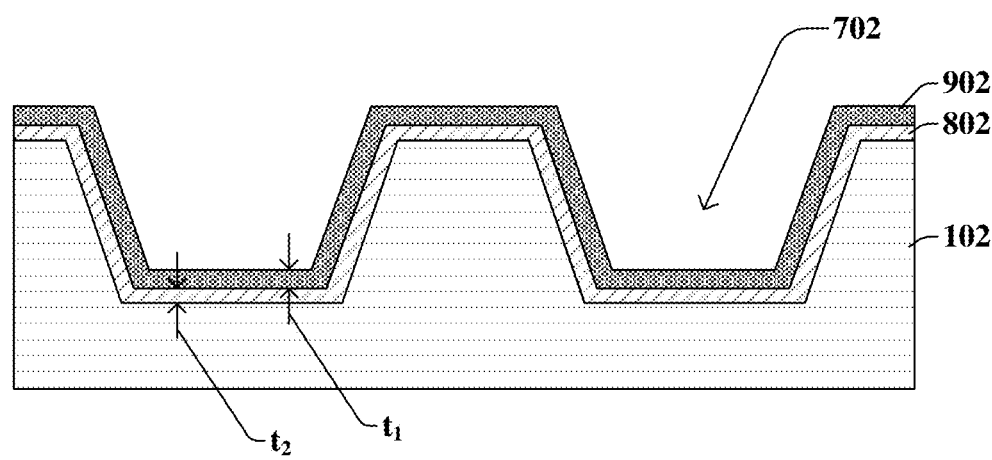

As shown in cross-sectional view 900 of FIG. 9, in some embodiments, a continuous first barrier layer 902 is formed over the continuous second barrier layer 802. In some embodiments, the continuous first barrier layer 902 comprises a second conductive material. In some embodiments, the second conductive material may be or comprise, for example, titanium, tantalum, or some other suitable conductive material. In some embodiments, the second conductive material of the continuous first barrier layer 902 is different than the third conductive material of the continuous second barrier layer 802. In some other embodiments, the second conductive material of the continuous first barrier layer 902 is the same as the third conductive material of the continuous second barrier layer 802.

In some embodiments, the continuous first barrier layer 902 is formed by way of a deposition process (e.g., PVD, CVD, ALD, sputtering, etc.). In some embodiments, the continuous first barrier layer 902 is formed to a first thickness $t_1$. In some embodiments, the first thickness $t_1$ is in a range of between, for example, approximately 25 angstroms and approximately 100 angstroms. The continuous first barrier layer 902 does not completely fill the second openings 702 of the substrate 102, and thus, the first thickness $t_1$ is less than a depth of the second openings 702 of the substrate 102.

Figure 10:
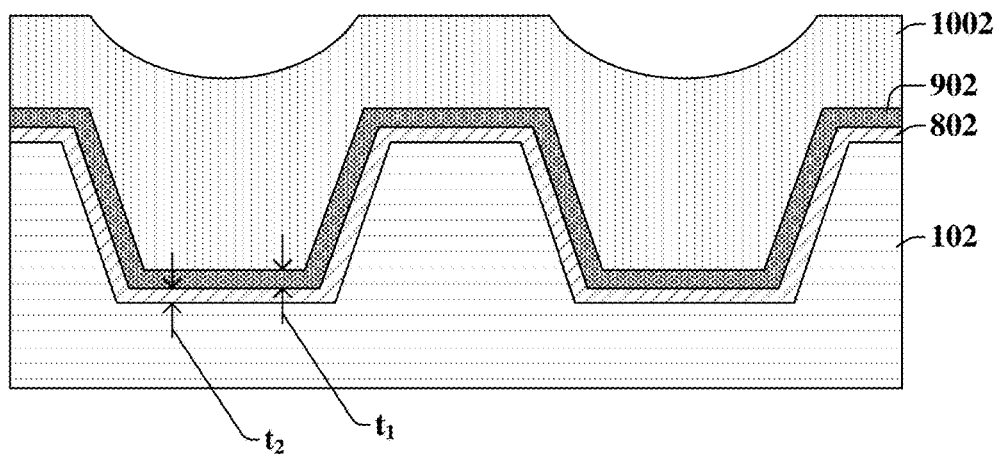

As shown in cross-sectional view 1000 of FIG. 10, in some embodiments, a first conductive material 1002 is formed over the continuous first barrier layer 902 and completely fills the second openings (702 of FIG. 9) of the substrate 102. In some embodiments, the first conductive material 1002 is formed by way of a deposition process (e.g., PVD, CVD, ALD, sputtering, etc.). In some embodiments, the first conductive material 1002 comprises, for example, aluminum, aluminum copper, or some other conductive material that has a lower resistance to oxidation than the second conductive material of the continuous first barrier layer 902 and than the third conductive material of the continuous second barrier layer 802.

In some embodiments, the resistance to oxidation of the first, second, and third conductive materials is measured by the Gibbs free energy of formation of the metal and oxygen to form the metal oxide. To properly compare the Gibbs free energy of formation amongst the different conductive materials, it will be appreciated that the Gibbs free energy is measured at the same conditions such as, a same temperature, pressure, and oxygen conditions. The more negative the Gibbs free energy of formation for a metal oxide, the easier the oxidation of that metal is, or in other words, the lower the resistance to oxidation that that metal has.

Figure 11:
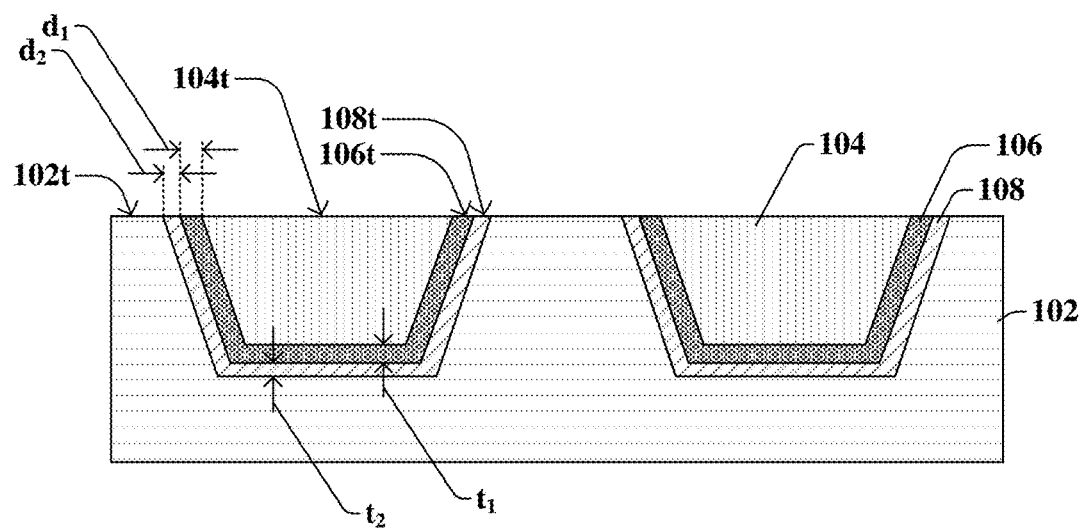

As shown in cross-sectional view 1100 of FIG. 11, in some embodiments, a removal process may be performed to remove portions of the continuous second barrier layer (802 of FIG. 10), the continuous first barrier layer (902 of FIG. 10), and the first conductive material (1002 of FIG. 10) arranged over a topmost surface 102t of the substrate 102 thereby forming a second barrier layer 108, a first barrier layer 106, and a conductive structure 104, respectively, within the substrate 102. In some embodiments, the removal process of FIG. 11 comprises a planarization process (e.g., chemical mechanical planarization (CMP)) such that a topmost surface 104t of the conductive structure 104, a topmost surface 106t of the first barrier layer 106, and a topmost surface 108t of the second barrier layer 108 are substantially coplanar with the topmost surface 102t of the substrate 102.

In some embodiments, after the planarization process of FIG. 11, the topmost surface 106t of the first barrier layer 106 has a width equal to a first distance $d_1$ in a range of between, for example, approximately 25 angstroms and approximately 100 angstroms. In some embodiments, after the planarization process of FIG. 11, the topmost surface 108t of the second barrier layer 108 has a width equal to a second distance $d_2$ in a range of between, for example, approximately 25 angstroms and approximately 100 angstroms.

Figure 12:
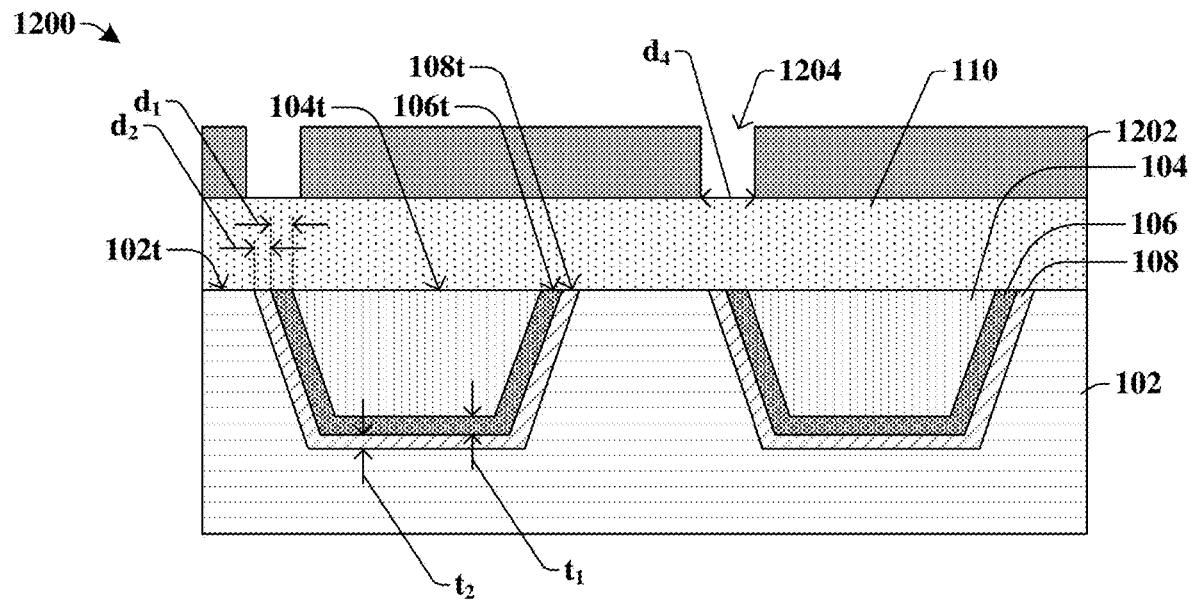

As shown in cross-sectional view 1200 of FIG. 12, in some embodiments, a dielectric layer 110 is formed over the substrate 102 and the conductive structure 104. In some embodiments, the dielectric layer 110 is formed by way of a deposition process (e.g., PVD, CVD, ALD, sputtering, etc.). In some embodiments, the dielectric layer 110 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Further, in some embodiments, a second masking structure 1202 is formed over the dielectric layer 110. In some embodiments, the second masking structure 1202 may be formed through various steps using deposition, photolithography, and removal (e.g., etching) processes. In some embodiments, the second masking structure 1202 comprises a photoresist material or a hard mask material. In some embodiments, the second masking structure 1202 comprises third openings 1204 formed by way of photolithography and removal (e.g., etching processes) according to a photoreticle in order to expose upper surfaces of the dielectric layer 110. In some embodiments, the third openings 1204 of the second masking structure 1202 have a width equal to a fourth distance $d_4$. In some embodiments, the fourth distance $d_4$ is less than or equal to a sum of the first and second distances $d_1$, $d_2$. In some other embodiments, the fourth distance $d_4$ is greater than a sum of the first and second distances $d_1$, $d_2$. In some embodiments, the third openings 1204 of the second masking structure 1202 directly overlie the topmost surface 106t of the first barrier layer 106 and the topmost surface 108t of the second barrier layer 108.

As shown in cross-sectional view 1300 of FIG. 13, in some embodiments a removal process is performed to remove portions of the dielectric layer 110 arranged below the third openings 1204 of the second masking structure 1202 thereby forming fourth openings 1302 within the dielectric layer 110. In some embodiments, the removal process of FIG. 13 comprises a wet and/or dry etching process. In some embodiments, the fourth openings 1302 extend completely through the dielectric layer 110 to expose the topmost surface 106t of the first barrier layer 106 and the topmost surface 108t of the second barrier layer 108. In some embodiments, the fourth openings 1302 do not expose the topmost surface 104t of the conductive structure 104 or the topmost surface 102t of the substrate 102. However, in some other embodiments, due to precision, accuracy, and processing limitations of the photolithography process to form the third openings 1204 of the second masking structure 1202 and/or processing limitations of the removal process of FIG. 13, portions of the topmost surface 104t of the conductive structure 104 and/or the topmost surface 102t of the substrate 102 may be exposed by the fourth openings 1302 in the dielectric layer 110.

In some embodiments, a bottom surface of the fourth openings 1302 are defined by exposed surfaces of the substrate 102, the conductive structure 104, the first barrier layer 106, and/or the second barrier layer 108. In some embodiments, the bottom surface of the fourth opening 1302 has a width equal to a third distance $d_3$. In some embodiments, the third distance $d_3$ is in a range of between, for example, approximately 50 angstroms and approximately 200 angstroms. In some embodiments, the third distance $d_3$ is less than or equal to a sum of the first and second distances $d_1$, $d_2$ such that the first and second barrier layers 106, 108 are exposed by the fourth openings 1302 but the conductive structure 104 and the substrate 102 are not exposed by the fourth openings 1302. In some other embodiments, even if the third distance $d_3$ is less than or equal to a sum of the first and second distances $d_1$, $d_2$, due to precision and accuracy of the photolithography and/or removal process of FIG. 13, the fourth openings 1302 may be shifted compared to what is illustrated in FIG. 13 such that portions of the substrate 102 or conductive structure 104 are exposed. In yet some other embodiments, due to limitations of the photolithography and/or removal process of FIG. 13, the third distance $d_3$ is greater than a sum of the first and second distances $d_1$, $d_2$ such that the topmost surface 102t of the substrate 102 and/or the topmost surface 104t of the conductive structure 104 are exposed.

In some embodiments, because the fourth openings 1302 of the dielectric layer 110 expose the topmost surface 106t of the first barrier layer 106 and the topmost surface 108t of the second barrier layer 108 to the air in the environment, oxygen from the air in the environment may react with the metals of the first and second barrier layers 106, 108 and form a metal-oxide residue on the topmost surface 106t of the first barrier layer 106 and the topmost surface 108t of the second barrier layer 108. In some embodiments, the topmost surface 106t of the first barrier layer 106 and the topmost surface 108t of the second barrier layer 108 may be exposed to the air in the environment for such a short period of time that no or very little metal-oxide residue is formed on the topmost surface 106t of the first barrier layer 106 and the topmost surface 108t of the second barrier layer 108. In some embodiments, the conductive structure 104 is not exposed by the fourth openings 1302 of the dielectric layer 110 and thus, significantly less metal-oxide residue is formed on the topmost surface 106t of the first barrier layer 106 and the topmost surface 108t of the second barrier layer 108 because the first and second barrier layers 106, 108 have a higher resistance to oxidation than the conductive structure 104. In some other embodiments, if the conductive structure 104 is exposed by the fourth openings 1302, metal-oxide residue will form on the topmost surface 104t of the conductive structure 104. However, less metal-oxide residue will form on the topmost surface 104t of the conductive structure 104 because less of the topmost surface 104t of the conductive structure 104 is exposed compared to if the fourth openings 1302 exposed only the conductive structure 104 and not the first and second barrier layers 106, 108.

Figure 13:
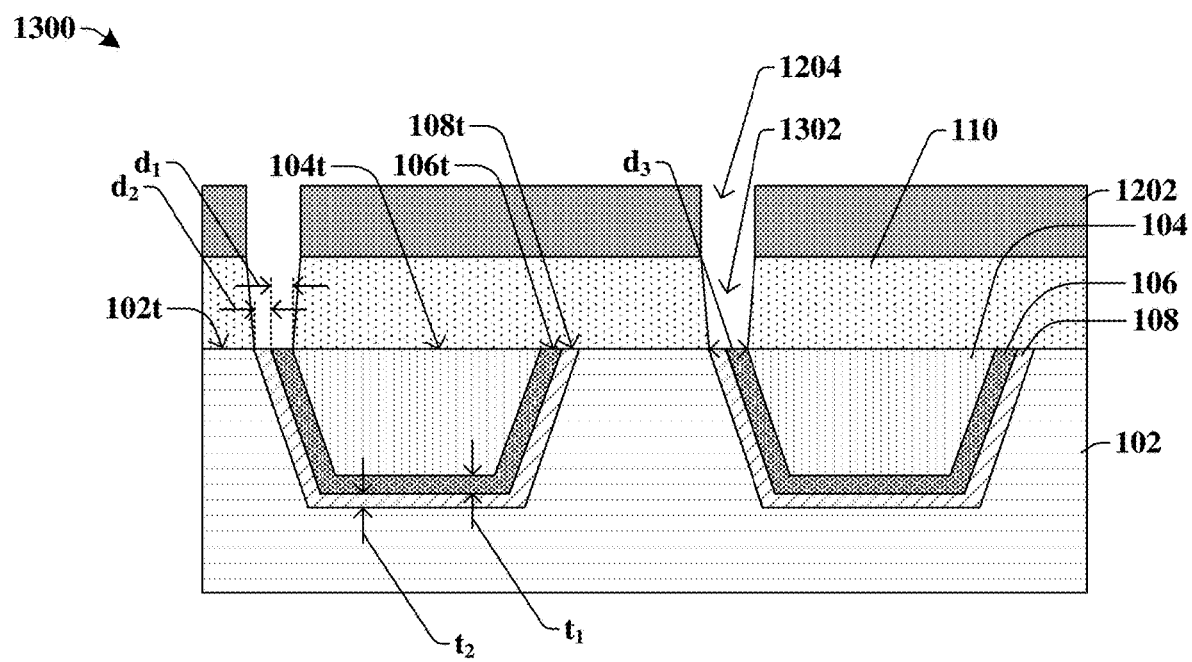
Figure 14:
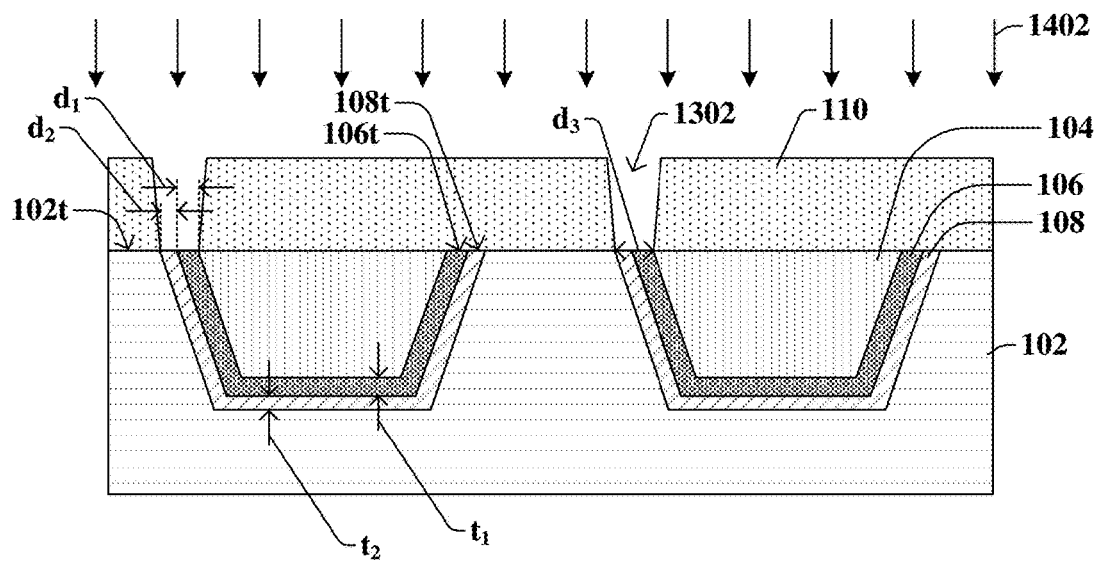

As shown in cross-sectional view 1400 of FIG. 14, in some embodiments, the second masking structure (1202 of FIG. 13) is removed, and a cleaning process 1402 is performed to remove any metal-oxide residue formed on the first barrier layer 106, the second barrier layer 108, and/or the conductive structure 104. In some other embodiments, the second masking structure (1202 of FIG. 13) is not yet removed and remains present during the cleaning process 1402. In some embodiments, less metal-oxide residue is formed on the first and second barrier layers 106, 108 because the first and second barrier layers 106, 108 have a higher resistance to oxidation than the conductive structure 104; thus, the time of the cleaning process 1402 is reduced compared to if the fourth openings 1302 exposed only the conductive structure 104. In some embodiments, the cleaning process 1402 is a plasma cleaning process. In some other embodiments, the cleaning process 1402 may comprise a wet clean, for example.

Figure 15:
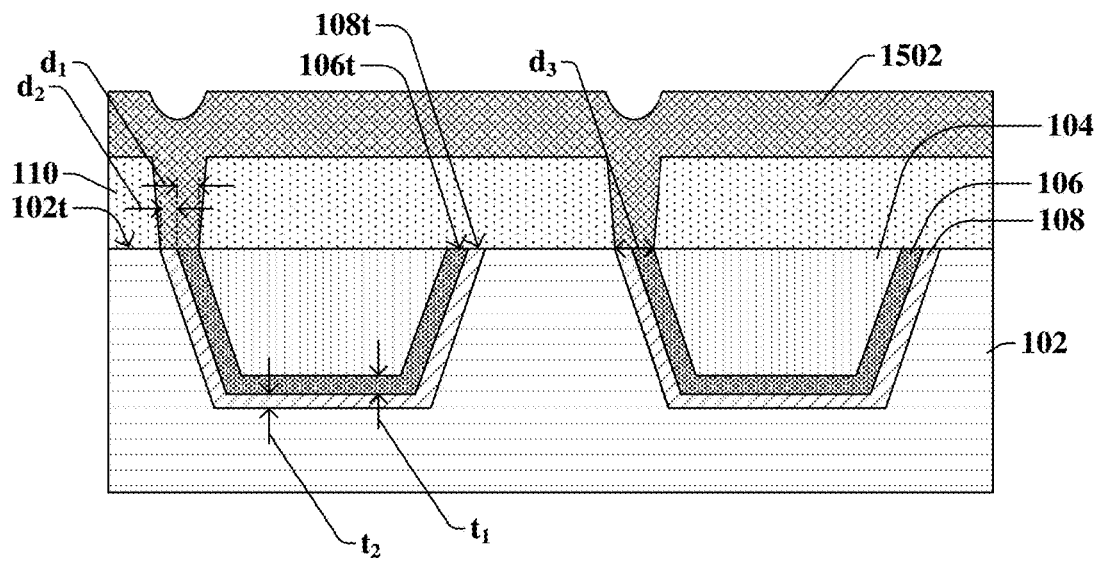

In some other embodiments, little to no metal-oxide residue is formed on the topmost surface 106t of the first barrier layer 106 and the topmost surface 108t of the second barrier layer 108 so the cleaning process 1402 is omitted and the method proceeds from FIG. 13 to FIG. 15, thereby skipping the steps of FIG. 14. Nevertheless, because of the reduced time or the omission of the cleaning process 1402, more integrated chips per time may be produced. In addition, in some embodiments, the less that the dielectric layer 110, the first barrier layer 106, and the second barrier layer 108 are exposed to the cleaning process 1402, the less likely inadvertent removal and/or damage to the dielectric layer 110, the first barrier layer 106, and the second barrier layer 108 will occur from the cleaning process 1402. Further, less metal-oxide may be present between the first and second barrier layers 106, 108 and a via structure (see, 112 of FIG. 15) to be formed within the fourth openings 1302 to reduce contact resistance and increase the reliability of the overall integrated chip.

As shown in cross-sectional view 1500 of FIG. 15, in some embodiments, a fourth conductive material 1502 is formed over the dielectric layer 110 to fill the fourth openings (1302 of FIG. 14) of the dielectric layer 110. In some embodiments, the fourth conductive material 1502 directly contacts the first and second barrier layers 106, 108. In some embodiments, the fourth conductive material 1502 is formed by way of a deposition process (e.g., PVD, CVD, ALD, sputtering, etc.). In some embodiments, the fourth conductive material 1502 comprises, for example, copper, aluminum, titanium, tantalum, tungsten, or some other suitable conductive material.

Figure 16:
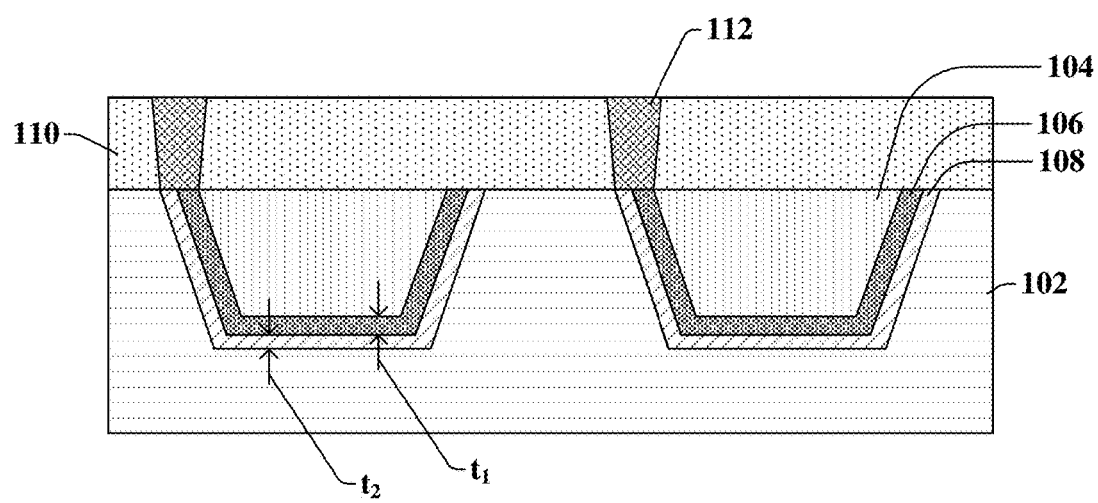

As shown in cross-sectional view 1600 of FIG. 16, in some embodiments, a removal process is performed to remove portions of the fourth conductive material (1502 of FIG. 15) arranged over upper surfaces of the dielectric layer 110 to form a via structure 112 extending through the dielectric layer 110, arranged directly over the topmost surface 106t of the first barrier layer 106 and the topmost surface 108t of the second barrier layer 108, and electrically coupled to the conductive structure 104 through the first and second barrier layers 106, 108. In some embodiments, the removal process of FIG. 16 comprises a planarization process (e.g., CMP) such that topmost surfaces of the via structure 112 and the dielectric layer 110 are substantially coplanar. Thus, the via structure 112 is formed on, or in other words, "land" on the topmost surface 106t of the first barrier layer 106 and the topmost surface 108t of the second barrier layer 108 to save time during manufacturing and to increase reliability of the overall device because the first and second barrier layers 106, 108 comprise materials more resistant to oxidation than the conductive structure 104.

Figure 17:
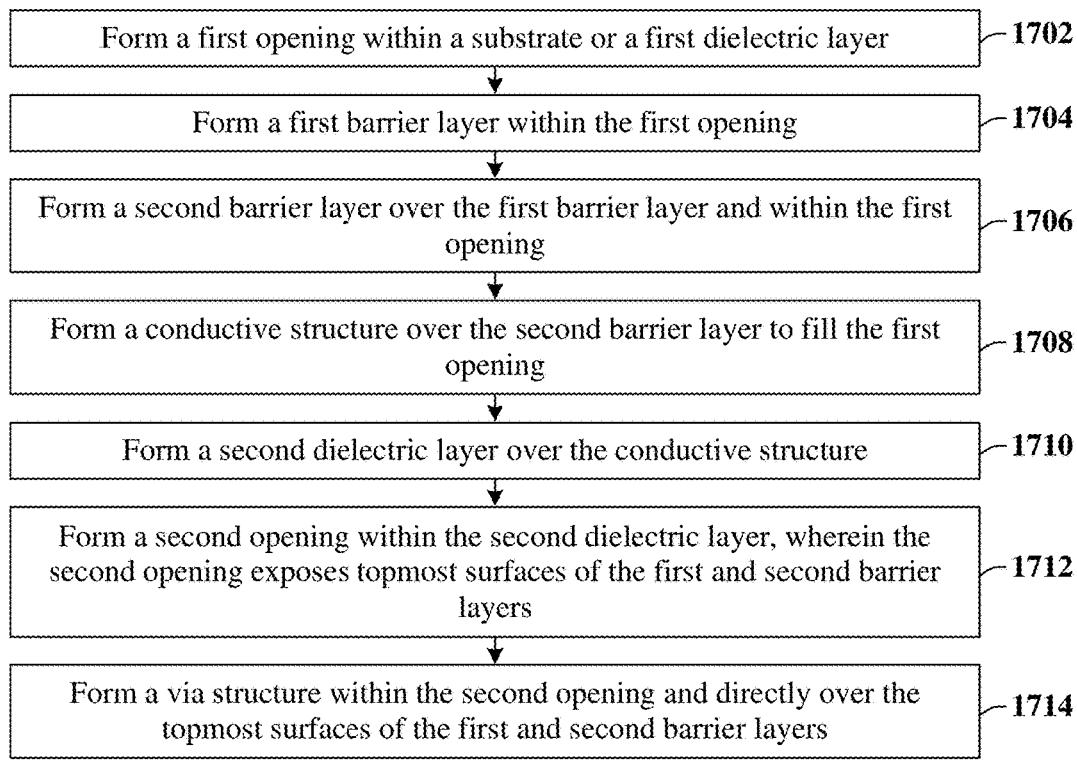
FIG. 17 illustrates a flow diagram of some embodiments of a method corresponding to FIGS. 6-16.

FIG. 17 illustrates a flow diagram of some embodiments of a method 1700 corresponding to the method shown in FIGS. 6-16.

While method 1700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1702, a first opening within a substrate or a first dielectric layer is formed. FIG. 7 illustrates cross-sectional view 700 of some embodiments corresponding to act 1702.

At act 1704, a first barrier layer is formed within the first opening. FIG. 8 illustrates cross-sectional view 800 of some embodiments corresponding to act 1704.

At act 1706, a second barrier layer is formed over the first barrier layer and within the first opening. FIG. 9 illustrates cross-sectional view 900 of some embodiments corresponding to act 1706.

At act 1708, a conductive structure is formed over the second barrier layer to fill the first opening. FIG. 11 illustrates cross-sectional view 1100 of some embodiments corresponding to act 1708.

At act 1710, a second dielectric layer is formed over the conductive structure. FIG. 12 illustrates cross-sectional view 1200 of some embodiments corresponding to act 1710.

At act 1712, a second opening is formed within the second dielectric layer, wherein the second opening exposes topmost surfaces of the first and second barrier layers. FIG. 13 illustrates cross-sectional view 1300 of some embodiments corresponding to act 1712.

At act 1714, a via structure is formed within the second opening and directly over the topmost surfaces of the first and second barrier layers. FIG. 16 illustrates cross-sectional view 1600 of some embodiments corresponding to act 1714.

Therefore, the present disclosure relates to a method of forming a conductive structure on a first barrier layer and a second barrier layer, wherein the first and second barrier layers have a lower ease of oxidation than the conductive structure such that a via structure may be formed directly on the first and second barrier layers instead of the conductive structure to reduce or prevent oxidation of the conductive structure.

Accordingly, in some embodiments, the present disclosure relates to an integrated chip comprising: a conductive structure arranged within a substrate or a first dielectric layer; a first barrier layer arranged on outermost sidewalls and a bottom surface of the conductive structure; a second barrier layer arranged on outer surfaces of the first barrier layer, wherein the second barrier layer separates the first barrier layer from the substrate or the first dielectric layer; a second dielectric layer arranged over the substrate or the first dielectric layer; and a via structure extending through the second dielectric layer, arranged directly over topmost surfaces of the first and second barrier layers, and electrically coupled to the conductive structure through the first and second barrier layers.

In other embodiments, the present disclosure relates to an integrated chip comprising: a conductive structure arranged within a substrate or a first dielectric layer; a first barrier layer arranged on outermost sidewalls and a bottom surface of the conductive structure; a second barrier layer arranged on outer surfaces of the first barrier layer, wherein the second barrier layer separates the first barrier layer from the substrate or the first dielectric layer; a second dielectric layer arranged over the substrate or the first dielectric layer; and a via structure extending through the second dielectric layer, having a bottommost surface arranged directly over topmost surfaces of the first and second barrier layers, and electrically coupled to the conductive structure, wherein the first barrier layer and the second barrier layer comprise materials more resistant to oxidation than a material of the conductive structure.

In yet other embodiments, the present disclosure relates to a method comprising: forming a first opening within a substrate or a first dielectric layer; forming a first barrier layer within the first opening; forming a second barrier layer over the first barrier layer and within the first opening; forming a conductive structure over the second barrier layer to fill the first opening; forming a second dielectric layer over the conductive structure; forming a second opening within the second dielectric layer, wherein the second opening exposes topmost surfaces of the first and second barrier layers; and forming a via structure within the second opening and over the topmost surfaces of the first and second barrier layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
    a conductive structure arranged within a substrate or a first dielectric layer;
    a first barrier layer arranged on outermost sidewalls and a bottom surface of the conductive structure;
    a second barrier layer arranged on outer surfaces of the first barrier layer, wherein the second barrier layer separates the first barrier layer from the substrate or the first dielectric layer;
    a second dielectric layer arranged over the substrate or the first dielectric layer; and
    a via structure extending through the second dielectric layer, arranged directly over topmost surfaces of the first and second barrier layers, and electrically coupled to the conductive structure through the first and second barrier layers, wherein the via structure has a smaller width than the conductive structure as viewed in a cross-sectional view.

2. The integrated chip of claim 1, wherein the via structure directly contacts the topmost surfaces of the first and second barrier layers.

3. The integrated chip of claim 1, further comprising:
    a third barrier structure arranged on outermost sidewalls and a bottom surface of the via structure, wherein the third barrier structure directly contacts the topmost surfaces of the first and second barrier layers.

4. The integrated chip of claim 1, wherein the first barrier layer comprises a first conductive material, wherein the second barrier layer comprises a second conductive material, wherein the conductive structure comprises a third conductive material, and wherein the first conductive material and the second conductive material are more resistant to oxidation than the third conductive material.

5. The integrated chip of claim 1, further comprising:
    a third dielectric layer arranged over the via structure;
    an additional conductive structure extending through the third dielectric layer and electrically coupled to the via structure;
    a third barrier layer arranged on outermost sidewalls and a bottom surface of the additional conductive structure, wherein the third barrier layer comprises a same material as the first barrier layer; and
    a fourth barrier layer arranged on outer surfaces of the third barrier layer, wherein the fourth barrier layer separates the third barrier layer from the third dielectric layer and the via structure.

6. The integrated chip of claim 1, wherein the conductive structure comprises aluminum, and wherein the first barrier layer comprises titanium.

7. The integrated chip of claim 1, further comprising:
    a source region within the substrate and on a first side of the conductive structure; and
    a drain region within the substrate and on a second side of the conductive structure, wherein the source and drain regions are spaced apart from the conductive structure by the first and second barrier layers.

8. The integrated chip of claim 1, wherein a bottommost surface of the via structure directly overlies a top surface of the conductive structure.

9. The integrated chip of claim 1, wherein a top surface of the conductive structure is completely covered by the second dielectric layer.

10. An integrated chip, comprising:
    a conductive structure arranged within a substrate or a first dielectric layer;
    a first barrier layer arranged on outermost sidewalls and a bottom surface of the conductive structure;
    a second barrier layer arranged on outer surfaces of the first barrier layer, wherein the second barrier layer separates the first barrier layer from the substrate or the first dielectric layer;
    an additional conductive structure arranged within the substrate or the first dielectric layer and laterally separated from the conductive structure;
    a first additional barrier layer arranged on outermost sidewalls and a bottom surface of the additional conductive structure;
    a second additional barrier layer arranged on outer surfaces of the first additional barrier layer;
    a second dielectric layer arranged over the substrate or the first dielectric layer;
    a via structure extending through the second dielectric layer, having a bottommost surface arranged directly over topmost surfaces of the first and second barrier layers, and electrically coupled to the conductive structure, wherein the via structure is arranged directly over a sidewall of the first barrier layer facing away from the additional conductive structure; and
    an additional via structure extending through the second dielectric layer, having a bottommost surface arranged directly over topmost surfaces of the first and second additional barrier layers, and electrically coupled to the additional conductive structure, wherein the additional via structure is arranged directly over a sidewall of the first additional barrier layer facing towards the conductive structure.

11. The integrated chip of claim 10, wherein the topmost surface of the first barrier layer has a first width, wherein the topmost surface of the second barrier layer has a second width, wherein the bottommost surface of the via structure has a third width, and wherein a sum of the first width and the second width is greater than or equal to the third width.

12. The integrated chip of claim 10, wherein the conductive structure has an outermost sidewall comprising copper and the first barrier layer comprises titanium nitride contacting the outermost sidewall of the conductive structure.

13. The integrated chip of claim 10, wherein the bottommost surface of the via structure directly overlies the substrate or the first dielectric layer.

14. The integrated chip of claim 10, wherein the bottommost surface of the via structure directly contacts the first and second barrier layers.

15. The integrated chip of claim 10, wherein the topmost surface of the first barrier layer has a first width, wherein the topmost surface of the second barrier layer has a second width, wherein the bottommost surface of the via structure has a third width, and wherein a sum of the first width and the second width is less than the third width.

16. The integrated chip of claim 15, wherein a top surface of the conductive structure is completely covered by the second dielectric layer, and wherein the bottommost surface of the via structure directly overlies the substrate or the first dielectric layer.

17. The integrated chip of claim 10, wherein the via structure is laterally off-centered from the conductive structure and centered upon the topmost surfaces of the first and second barrier layers.

18. An integrated chip, comprising:
 a conductive structure arranged within a substrate or a first dielectric;
 source/drain regions disposed within the substrate along opposing sides of the conductive structure;
 a first barrier layer arranged along one or more outer surfaces of the conductive structure;
 a second barrier layer arranged along one or more outer surfaces of the first barrier layer, wherein the first barrier layer physically separates the second barrier layer from the conductive structure;
 a second dielectric arranged over the substrate or the first dielectric; and
 a via structure extending through the second dielectric to the first and second barrier layers, wherein the via structure laterally extends past an outermost sidewall of the second barrier layer.

19. The integrated chip of claim 18, wherein a bottom of the via structure extends to over the substrate or the first dielectric.

20. The integrated chip of claim 18, wherein the first barrier layer is titanium nitride.

* * * * *